United States Patent [19]

Lin

[11] Patent Number: 5,493,475
[45] Date of Patent: Feb. 20, 1996

[54] COOLING DEVICE FOR AN INTEGRATED CIRCUIT

[76] Inventor: Shih-jen Lin, 1st Fl., No. 360, Tanan Rd., Taipei, Taiwan

[21] Appl. No.: 394,610

[22] Filed: Feb. 27, 1995

[51] Int. Cl.⁶ .................................................... H05H 7/20
[52] U.S. Cl. ..................... 361/710; 165/86.2; 165/86.3; 165/185; 174/16.3; 257/719; 361/718
[58] Field of Search .................................. 165/80.2, 80.3, 165/185; 174/16.3; 257/718–719, 726–727; 248/510; 361/690, 695–697, 704, 707, 709–710, 715, 717–719, 722; 439/73, 485, 487

[56] References Cited

U.S. PATENT DOCUMENTS

| | | | |
|---|---|---|---|
| 5,251,101 | 10/1993 | Lin | 361/717 |
| 5,276,585 | 1/1994 | Smithers | 361/709 |
| 5,287,249 | 2/1994 | Chen | 361/718 |
| 5,323,845 | 6/1994 | Kin-shon | 174/16.3 |

Primary Examiner—Gregory D. Thompson
Attorney, Agent, or Firm—Parkhurst, Wendel & Rossi

[57] ABSTRACT

A cooling device includes a radiator. Each of two frames includes a central wall, first and second side walls protecting from the central wall, two claws formed on the central wall, a tab formed at a connection between the central wall and each of the side walls, two separated barbs formed on the first side wall, two cutouts defined in the second side wall. Each of two bolts includes two terminal portions and a central portion biased from the terminal portions. Each of handles protects perpendicularly from one of the terminal portions of a corresponding one of the bolts. An integrated circuit to be cooled by the cooling device is received in a socket including four corners. The radiator is located on the integrated circuit. The frames are assembled about the socket by engagement of the barbs with the cutouts while the tabs are located below four corners of the socket. Each of the bolts is inserted through the first hole defined in one of the frames and the second hole defined in the remaining one of the frames. The handles are pivotable for rotating the bolts thus abutting the radiator against the integrated circuit by the central portions of the bolts. The handles can be retained by the claws.

6 Claims, 3 Drawing Sheets

COOLING DEVICE FOR AN INTEGRATED CIRCUIT

BACKGROUND OF THE INVENTION

This invention relates to a cooling device for an integrated circuit (IC).

A conventional cooling device includes a frame and a radiator. An IC is located between the frame and the radiator. The frame defines a central opening through which leads of the IC are inserted. The frame includes a plurality of hooks projecting upwardly therefrom. The radiator includes a base and a plurality of fins projecting upwardly from the base. The hooks can be in engagement with edges of the base of the radiator so that the IC, the frame and the radiator are joined together. The IC is received in a socket installed on a circuit board. Application of the cooling device to the IC is easy before the installation of the IC on the circuit board. However, application of the cooling device to the IC is impossible after the installation of the IC on the circuit board.

SUMMARY OF THE INVENTION

It is an objective of this invention to provide a cooling device including a radiator. Each of two frames includes a central wall, first and second side walls projecting from the central wall, two claws formed on the central wall, a tab formed at a connection between the central wall and each of the side walls, two separated barbs formed on the first side wall, two cutouts defined in the second side wall. Each of two bolts includes two terminal portions and a central portion biased from the terminal portions. Each of handles projects perpendicularly from one of the terminal portions of a corresponding one of the bolts. An integrated circuit to be cooled by means of the cooling device is received in a socket including four corners. The radiator is located on the integrated circuit. The frames are assembled about the socket by means of engagement of the barbs with the cutouts while the tabs are located below four corners of the socket. Each of the bolts is inserted through the first hole defined in one of the frames and the second hole defined in the remaining one of the frames. The handles are pivotable for rotating the bolts thus abutting the radiator against the integrated circuit by means of the central portions of the bolts. The handles can be retained by means of the claws.

BRIEF DESCRIPTION OF THE INVENTION

DETAILED DESCRIPTION OF THE INVENTION

Figure 1:
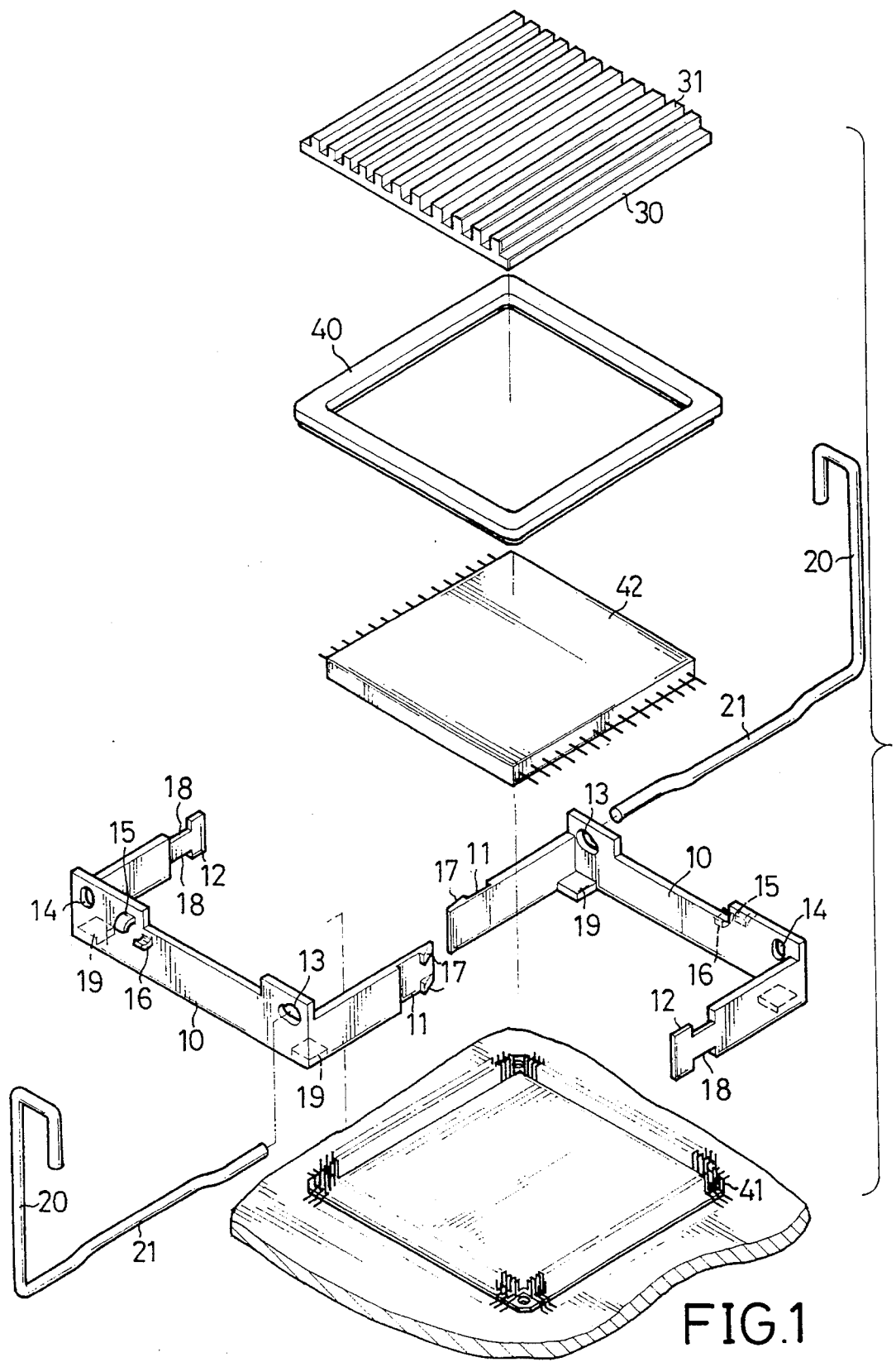
FIG. 1 is an exploded view of a cooling device for an IC installed on a circuit board.

FIG. 1 shows a portion of a printed circuit board (PCB) (not numbered). A conventional socket is used to retain an IC 42 on the PCB. The socket includes a seat 41 defining a central cavity (not numbered) and a retainer 40 defining a central opening. The seat 41 is installed on the PCB. The IC 42 is received in the central cavity defined in the seat 41. The retainer 40 is secured to the seat 41 thus retaining the IC 42 in the socket.

A radiator 30 includes a base (not numbered) and a plurality of fins 31 projecting upwardly from the base. The base of the radiator 30 is mounted on the IC 42 through the central opening defined in the retainer 40.

Figure 2:
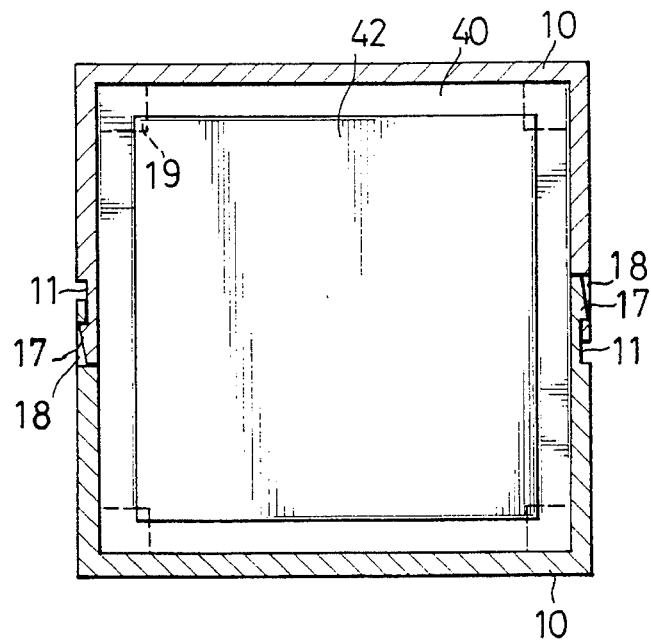
FIG. 2 is a cross-sectional horizontal view of the cooling device as shown in FIG. 1.

Each of two frames 10 is U-shaped as shown in FIG. 2. Each of the frames 10 includes a central wall and first and second side walls extending perpendicularly from the central wall. The first side wall of each of the frames 10 includes a first thin portion 11 while the remaining one of the side walls includes a second thin portion 12. Two separated barbs 17 are formed on a side of the first thin portion 11 of each of the frames 10. Two cutouts 18 are defined in the second thin portion 12 of each of the frames 10. A tab 19 is formed at a connection between the central wall and each of the side walls of each of the frames 10. The central wall of each of the frames 10 defines a first hole 13 near the first side wall and a second hole 14 near the second side wall. Two claws 15 and 16 are formed on the central wall of each of the frames 10.

The frames 10 are assembled by inserting the barbs 17 formed on one of the frames 10 into the cutouts 18 defined in the remaining one of the frames 10. The tabs 19 are located below four corners of the retainer 40.

Each of two locking members (not numbered) includes a handle 20 and a bolt 21 projecting perpendicularly from the handle 20. The bolt 21 includes two terminal portions and a central portion biased from the terminal portions.

Figure 3:
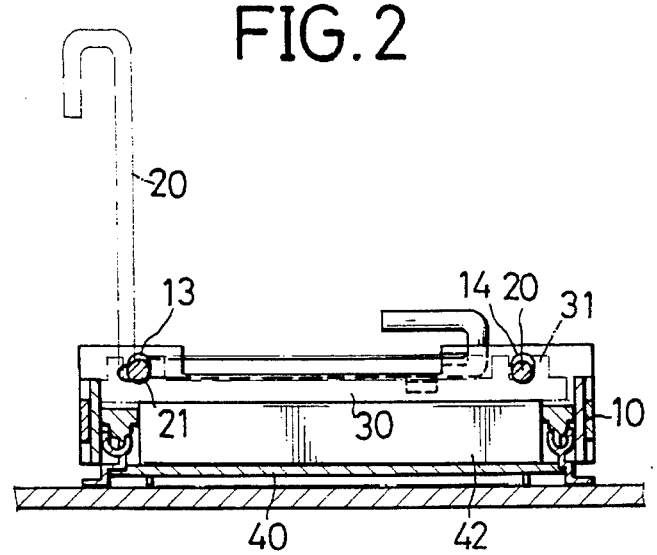
FIG. 3 is a cross-sectional vertical view of the cooling device as shown in FIG. 1.
Figure 4:
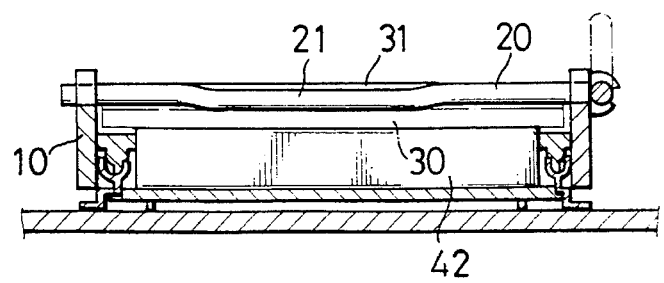
FIG. 4 is a cross-sectional vertical view of the cooling device as shown in FIG. 1.

Each of the bolts 21 is inserted through the first hole 13 defined in one of the frames 10 and the second hole 14 defined in the remaining one of the frames 10. The bolts 21 can be rotated by pivoting the handles 20 from a position as shown in FIG. 1 to a position as shown in FIGS. 3 and 4. In the position as shown in FIGS. 3 and 4, the base of the radiator 30 is firmly abutted against the IC by means of the central portions of the bolts 21. Each of the handles 20 can be held by means of the claws 15 and 16 formed on a corresponding one of the frames 10.

Figure 5:
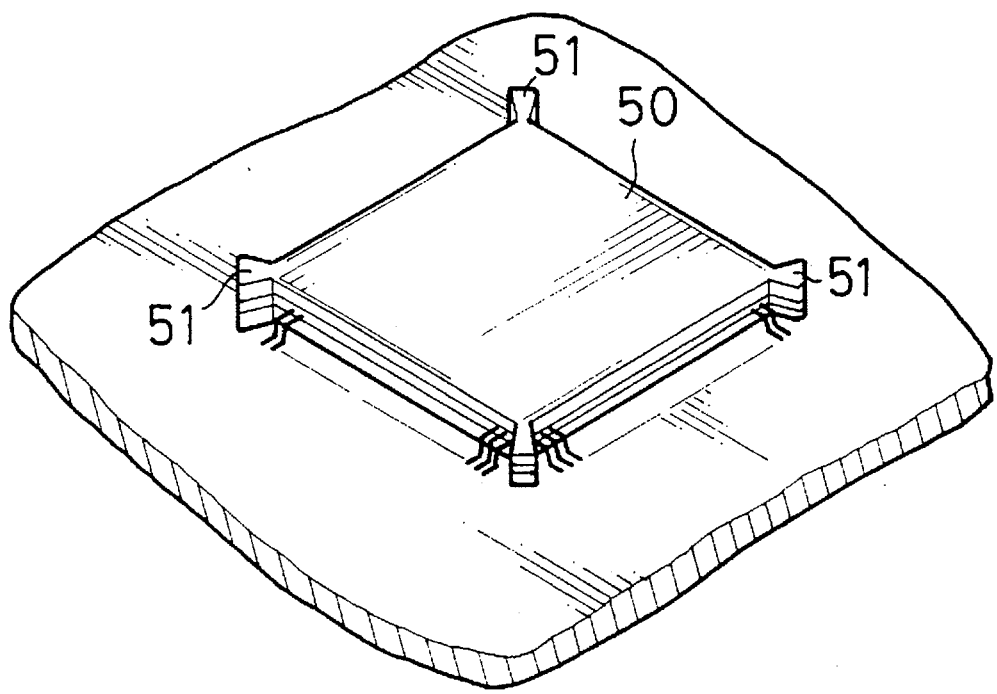
FIG. 5 is a perspective view of another IC to which application of the cooling device as shown in FIGS. 1–4 is possible.

FIG. 5 shows an IC 50 directly installed on printed circuit board. The IC 50 includes four blocks 51 each formed at a corresponding one of four corners. Referring to FIG. 1, the frames 10 and the locking members can be used to retain the radiator 30 on the IC 50 with the tabs 19 in engagement with the blocks 51.

I claim:

1. A cooling device comprising:

a radiator;

first and second frames each including a central wall, first and second side walls projecting from the central wall, two claws extending from the central wall, a tab extending between the central wall and each of the side walls, two separated barbs on the first side wall, two cutouts defined in the second side wall, and first and second holes extending through the central wall;

first and second bolts each including two terminal portions and a central portion biased from the terminal portions; and two handles each projecting perpendicularly from one of the terminal portions of a corresponding one of the bolts;

wherein the frames are adapted to be assembled about a socket that receives an integrated circuit, the frames are assembled by engagement of the barbs with the cutouts, the first bolt is inserted through the first hole in the first frame and the second hole in the second frame, the second bolt is inserted through the first hole in the second frame and the second hole of the first frame, and the handles are pivotable for rotating the bolts to bias the radiator against such an integrated circuit by the central portions of the bolts, the handles being retained by the claws.

2. A cooling device according to claim 1 wherein the first side wall of each of the frames includes a thin terminal portion on which the barbs are defined, the second side wall of each of the frames includes a thin terminal portion in which the cutouts are defined.

3. A cooling device according to claim 1 wherein the radiator includes a base and a plurality of fins projecting upwardly from the base.

4. A cooling device comprising;

a radiator;

first and second frames each including a central wall, first and second side walls projecting from the central wall, two claws extending from the central wall, a tab extending between the central wall and each of the side walls, two separated barbs on the first side wall, two cutouts defined in the second side wall, and first and second holes extending through the central wall;

first and second bolts each including two terminal portions and a central portion biased from the terminal portions; and two handles each projecting perpendicularly from one of the terminal portions of a corresponding one of the bolts;

wherein the frames are adapted to be assembled about an integrated circuit by engagement of the barbs with the cutouts, the first bolt is inserted through the first hole in the first frame and the second hole in the second frame, the second bolt is inserted through the first hole in the second frame and the second hole of the first frame, and the handles are pivotable for rotating the bolts for biasing the radiator against such an integrated circuit by the central portions of the bolts, the handles being retained by the claws.

5. A cooling device according to claim 4 wherein the first side wall of each of the frames includes a thin terminal portion on which the barbs are defined, the second side wall of each of the frames includes a thin terminal portion in which the cutouts are defined.

6. A cooling device according to claim 4 wherein the radiator includes a base and a plurality of fins projecting upwardly from the base.

* * * * *